(12) United States Patent
Fukuoka et al.

(10) Patent No.: US 10,388,628 B2
(45) Date of Patent: Aug. 20, 2019

(54) ELECTRONIC COMPONENT PACKAGE

(71) Applicant: KYOCERA Corporation, Kyoto-shi, Kyoto (JP)

(72) Inventors: Yasuhiko Fukuoka, Yokohama (JP); Tadao Yamasako, Kirishima (JP); Masashi Hirooka, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 15/773,987

(22) PCT Filed: Nov. 11, 2016

(86) PCT No.: PCT/JP2016/083592
§ 371 (c)(1),
(2) Date: May 4, 2018

(87) PCT Pub. No.: WO2017/082416
PCT Pub. Date: May 18, 2017

(65) Prior Publication Data
US 2018/0331068 A1    Nov. 15, 2018

(30) Foreign Application Priority Data
Nov. 11, 2015   (JP) .................................. 2015-221684

(51) Int. Cl.
*H01L 25/065* (2006.01)
*H01L 25/07* (2006.01)
(Continued)

(52) U.S. Cl.
CPC .......... *H01L 25/065* (2013.01); *H01L 23/147* (2013.01); *H01L 23/3142* (2013.01);
(Continued)

(58) Field of Classification Search
CPC . H01L 23/147; H01L 23/3142; H01L 25/065; H01L 25/07; H01L 25/18; H01L 24/48
See application file for complete search history.

(56) References Cited

U.S. PATENT DOCUMENTS 6,472,741 B1 * 10/2002 Chen .................... H01L 23/3128
  257/712
8,283,767 B1 * 10/2012 Berry .................... H01L 21/561
  257/686

(Continued)

FOREIGN PATENT DOCUMENTS

JP      9-180788 A     7/1997
JP      2001-210954 A  8/2001
(Continued)

*Primary Examiner* — Peniel M Gumedzoe
(74) *Attorney, Agent, or Firm* — Hauptman Ham, LLP

(57) ABSTRACT

An electronic component package according to an embodiment of the present disclosure includes a first substrate, a sealing member, a second substrate, and connectors. The first substrate has a first top surface on which a first electronic component is mounted. The sealing member is positioned on the first top surface and configured to seal the first electronic component and a second electronic component. The second substrate has a second top surface on which the second electronic component is mounted, and is positioned within the sealing member. The connectors electrically couple the first substrate and the second substrate.

10 Claims, 10 Drawing Sheets

(51) Int. Cl.
   *H01L 25/18*   (2006.01)
   *H01L 23/00*   (2006.01)
   *H01L 23/31*   (2006.01)
   *H01L 23/14*   (2006.01)
   *H05K 1/14*    (2006.01)
   *H05K 3/28*    (2006.01)
   *H01L 23/538*  (2006.01)
   *H01L 25/16*   (2006.01)

(52) U.S. Cl.
   CPC .............. *H01L 24/48* (2013.01); *H01L 25/07* (2013.01); *H01L 25/18* (2013.01); *H05K 1/144* (2013.01); *H05K 3/284* (2013.01); *H01L 23/5389* (2013.01); *H01L 25/162* (2013.01); *H01L 2224/16227* (2013.01); *H01L 2224/48227* (2013.01); *H01L 2224/97* (2013.01); *H01L 2924/181* (2013.01); *H05K 2201/042* (2013.01); *H05K 2201/10674* (2013.01)

(56) References Cited

U.S. PATENT DOCUMENTS

| | | | |
|---|---|---|---|
| 2006/0172457 A1* | 8/2006 | Huang | H01L 24/85 438/106 |
| 2008/0155820 A1* | 7/2008 | Arai | H01L 21/565 29/830 |
| 2010/0320583 A1* | 12/2010 | Camacho | H01L 23/3128 257/686 |
| 2011/0128713 A1* | 6/2011 | Kawano | H01L 23/66 361/784 |
| 2013/0084678 A1 | 4/2013 | Jeong | |
| 2014/0233199 A1 | 8/2014 | Munakata et al. | |
| 2015/0249065 A1 | 9/2015 | Pagaila | |

FOREIGN PATENT DOCUMENTS

| | | |
|---|---|---|
| JP | 2006-261387 A | 9/2006 |
| JP | 2008-311267 A | 12/2008 |
| JP | 2010-118369 A | 5/2010 |

* cited by examiner

FIG. 1
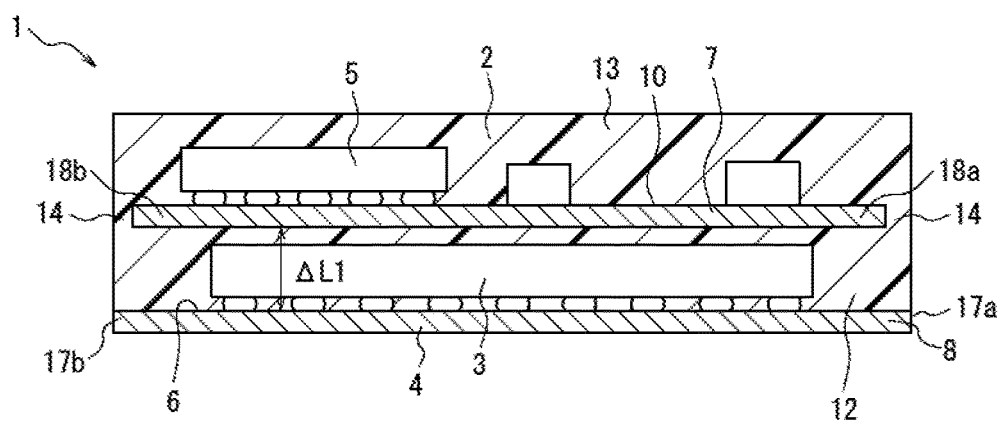
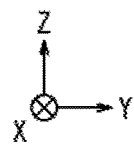

FIG. 5
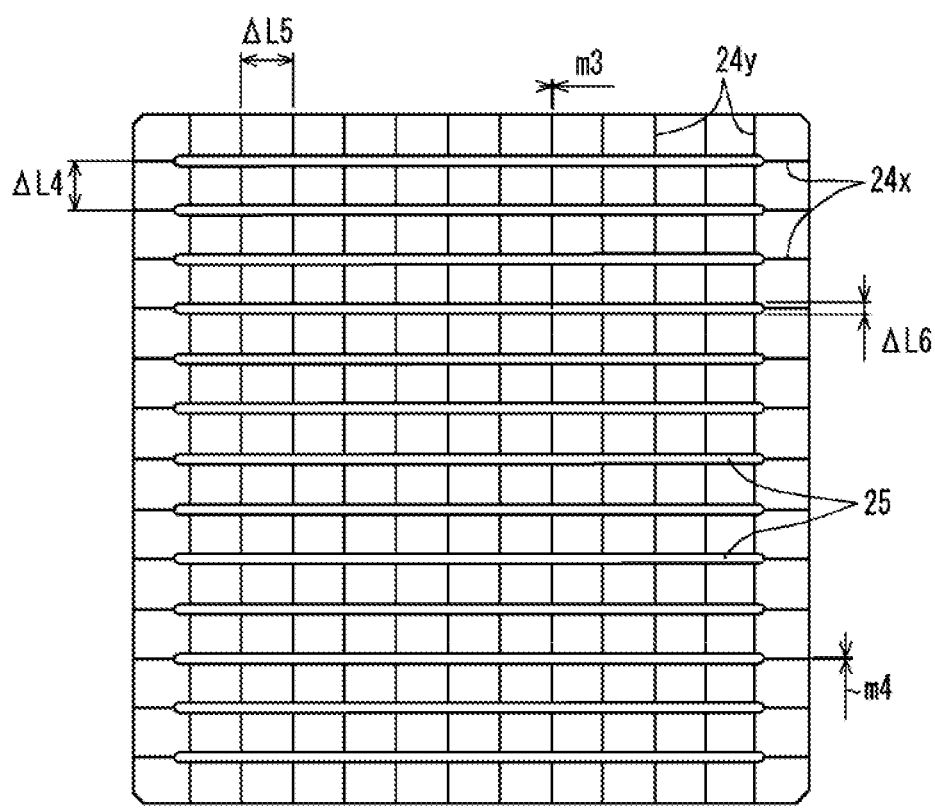
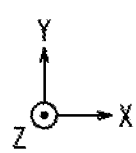

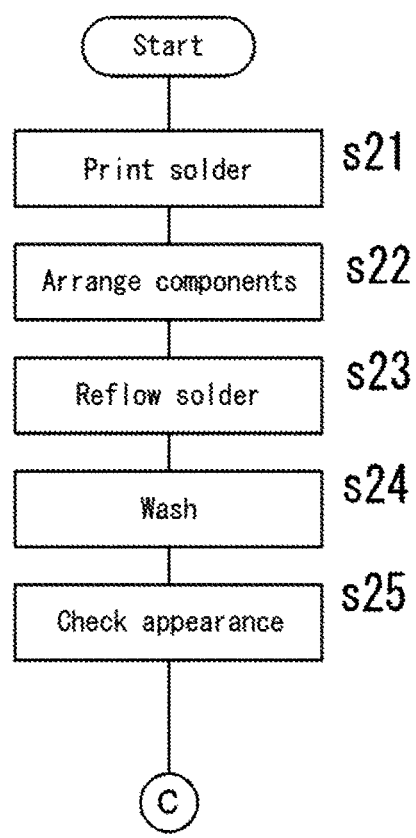

US 10,388,628 B2

ELECTRONIC COMPONENT PACKAGE

CROSS REFERENCE TO RELATED APPLICATION

The present application is a National Phase of International Application Number PCT/JP2016/083592, filed Nov. 11, 2016, which claims priority to Japanese Application Number 2015-221684, filed Nov. 11, 2015. The entire contents of Japanese Patent Application No. 2015-221684 filed on Nov. 11, 2015, are incorporated herein by reference.

TECHNICAL FIELD

The present disclosure relates to an electronic component package that includes a POP (Package On Package) in which at least two electronic component mounting substrates having electronic component mounted thereon are stacked.

BACKGROUND

To meet demand for increasingly compact electronic devices, electronic component packages known as POP (Package On Package) in which semiconductor packages are vertically stacked and integrally layered are conventionally used. PLT 1 set forth below describes a multilayer substrate as an example of a prior art electronic component packages.

This prior art electronic component packages includes a first substrate having a first electronic component mounted thereon, a second substrate having a second electronic component mounted thereon, and a frame serving as a connector for electrically coupling the first substrate and the second substrate by joining a periphery of the first substrate and a periphery of the second substrate.

CITATION LIST

Patent Literature

PLT 1: JP-A-2001-210954

SUMMARY

An electronic component package according to one of embodiments of the present disclosure includes a first substrate, a sealing member, a second substrate, and a connector. The first substrate includes a first surface having a first electronic component mounted thereon. The sealing member is positioned on the first surface and configured to seal the first electronic component and a second electronic component. The second substrate includes a second surface having the second electronic component mounted thereon and is positioned within the sealing member. The connector electrically couples the first substrate and the second substrate.

BRIEF DESCRIPTION OF THE DRAWINGS

In the accompanying drawings:
FIG. 1 is a cross-sectional view of an electronic component package according to one of embodiments;
FIG. 5 is a plan view of a second substrate base member;
FIG. 7 is a flowchart illustrating an example of a manufacturing process of an electronic component package.

DETAILED DESCRIPTION

In a conventional electronic component package in which two or more substrates each having electronic components mounted thereon are joined together by a frame around the substrates and solder bumps alone, an upper substrate is supported by a contact or a surface smaller than an area of the upper substrate. In the electronic component package according to the present disclosure, a second substrate arranged on top of a first substrate is positioned within a sealing member having a columnar shape provided on the first substrate. The electronic component package according to the present disclosure includes the sealing member that integrally supports the first substrate and the second substrate, and thus joins them more strongly than the electronic component package in which the substrates are joined together by the frame and the solder bumps alone. According to the present embodiment, positioned within the sealing member includes being inscribed within a side surface of the sealing member. Hereinafter, the electronic component package of the present disclosure will be described in detail.

Figure 2:
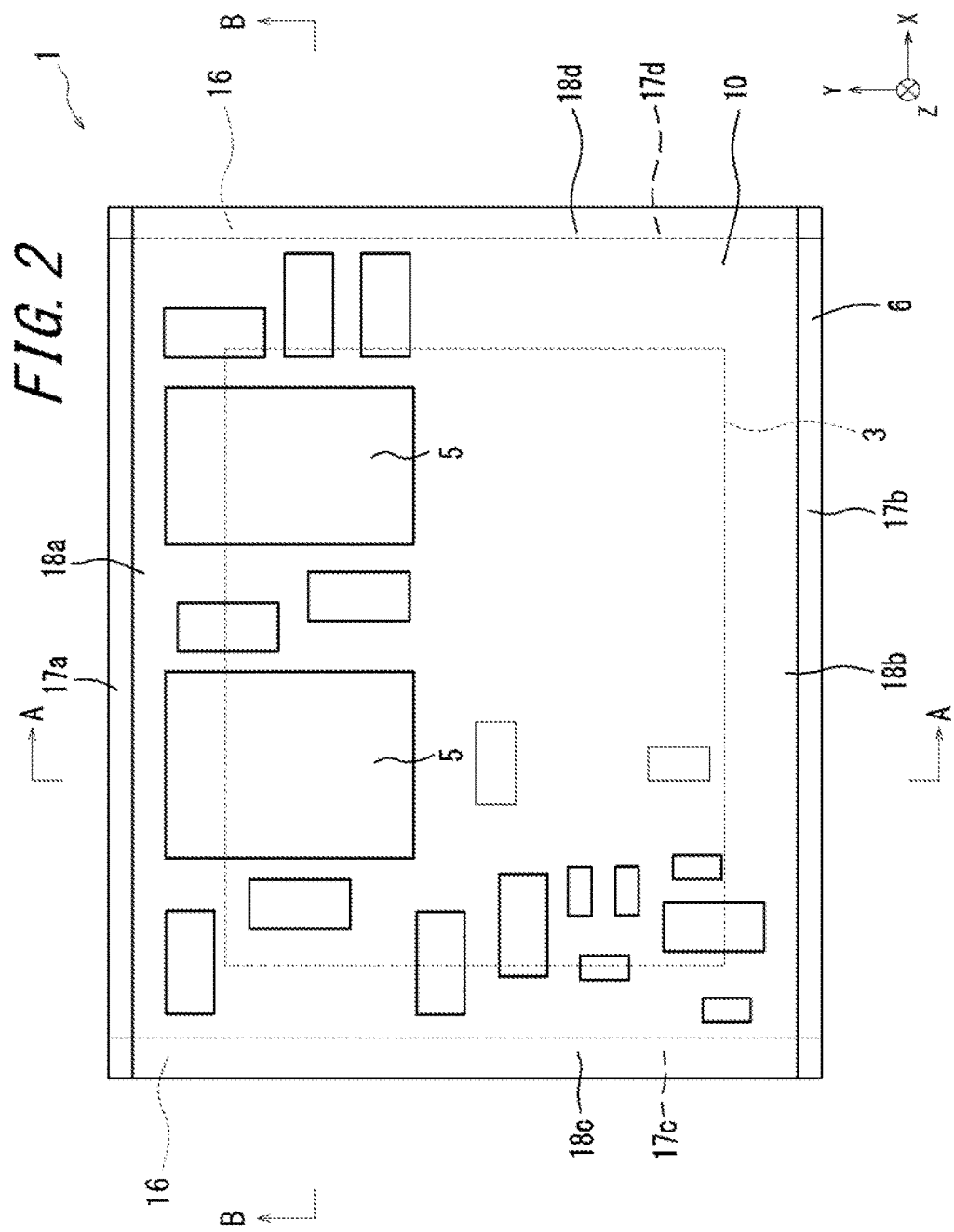
FIG. 2 is a plan view of the electronic component package in which a sealing member is omitted.
Figure 3:
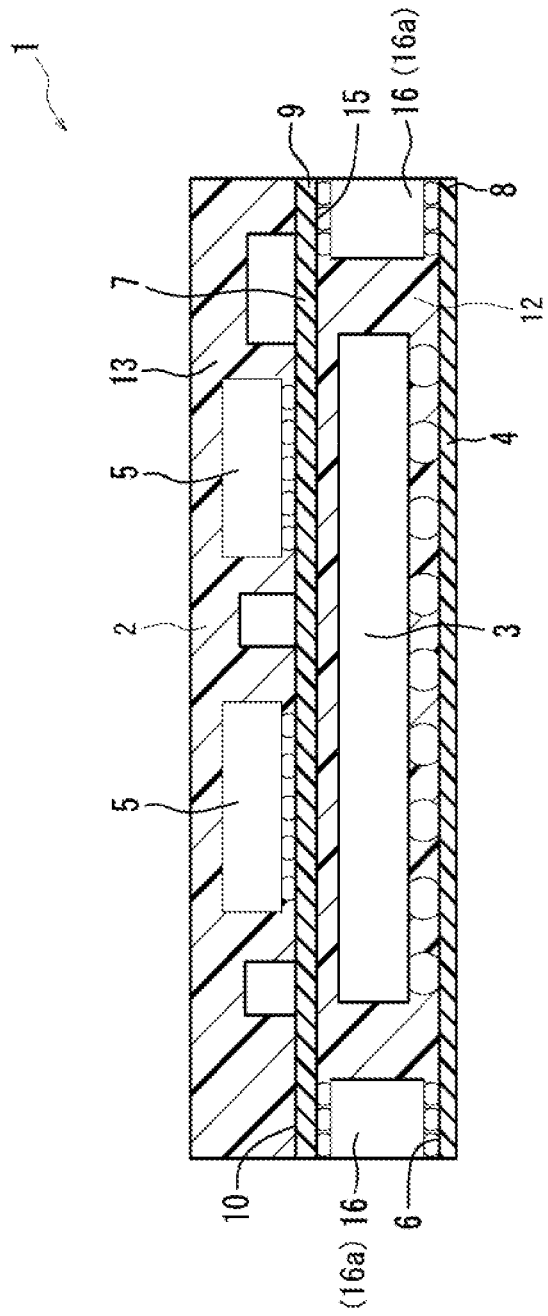
FIG. 3 is a cross-sectional view taken from line B-B of FIG. 2.

FIG. 1 is a cross-sectional view of an electronic component package 1 according to an embodiment. FIG. 2 is a plan view of the electronic component package 1 in which a sealing member is omitted. FIG. 1 is a cross-sectional diagram taken from line A-A of FIG. 2. FIG. 3 is a cross-sectional diagram taken from line B-B of FIG. 2. The electronic component package 1 includes a first substrate 4 that has a first top surface 6 on which a first electronic component 3 is mounted, and a second substrate 7 that has a second top surface 10 on which a second electronic component 5 is mounted. The first top surface 6 is a first surface. The second top surface 10 is a second surface. The second substrate 7 is arranged substantially parallel with the first substrate 4 over the first top surface 6 of the first substrate 4 with a space ΔL1 therebetween in a direction Z orthogonal to the first top surface 6. The second substrate 7 is smaller than the first substrate 4. In a plan view of the first substrate 4 and the second substrate 7 viewed from a position remote from the second substrate 7 in a direction opposite to the Z direction, an area of the second substrate 7 is included in an area of the first substrate 4. In the plan view viewed in the direction opposite to the Z-direction, a periphery of the second substrate 7 may partially coincide with a periphery of the first substrate 4. According to some embodiments, the first substrate 4 and the second substrate 7 each have a rectangular shape with two sides that are perpendicular to each other and extending along a first direction X and a second direction Y, respectively. The second substrate 7 has a length in the first direction X the same as the length of the first substrate 4 in the first direction X and a length in the second direction Y shorter than the length of the first substrate 4 in the second direction Y. Note that "parallel" used herein does not need to be strictly parallel but may allow a slight error or inclination caused during manufacturing.

The sealing member 2 is positioned on the first top surface 6 of the first substrate 4. The sealing member 2 may extend throughout the periphery of the first top surface 6. The sealing member 2 may be positioned on the first top surface 6 in its entirety. Note that "in its entirety" used herein may exclude a contact point electrically coupled to another element. The second substrate 7 is positioned within the sealing member 2. The second substrate 7 is substantially parallel with the first substrate 4, allowing some deviation caused by a manufacturing error etc. In the electronic component package 1, the sealing member 2 is integrally formed in a first space 12, a second space 13, and a third space 14. The first space 12 is a space between the first substrate 4 and the second substrate 7. The second space 13 is a space on the second substrate 7. The third space 14 may be a clearance yielded by portions of the second substrate 7 narrower than the first substrate 4 in a plan view. The third space 14 is a space above a portion of the first substrate 4 protruding from the second substrate 7 in plan view. The sealing member 2 seals the first electronic component 3 on the first substrate 4 and the second electronic component 5 on the second substrate 7. The electronic component package 1 may be referred to as a POP (Package On Package).

The first substrate 4 includes a first wiring conductor forming a predetermined wiring pattern on the first top surface 6. The first wiring conductor is coupled to the first electronic component 3. The first electronic component 3 may include an active electronic component, such as an IC chip, that generates heat during operation. The second substrate 7 includes the second top surface 10 having the second electronic component 5 mounted thereon. The second substrate 7 includes a second connection conductor forming a predetermined wiring pattern on the second top surface 10. The second connection conductor is coupled to the second electronic component 5. The second electronic component 5 includes the active electronic component, such as the IC chip, that generates heat during operation. On the first top surface 6 and the second top surface 10, in addition to the first electronic component 3 and the second electronic component 5, various electronic components including a chip inductor, a chip capacitor, a diode, a chip resistor, etc. may be mounted. In FIGS. 1 to 3, these electronic components are indicated simply by rectangles without reference numerals. According to the present disclosure, the first wiring conductor and the second wiring conductor may be collectively referred to as a wiring conductor without distinction.

Materials for the first substrate 4 and the second substrate 7 may be respectively selected from organic insulating materials, inorganic insulating materials, and composite insulating materials obtained by binding an inorganic insulating material with a thermosetting resin such as an epoxy resin. The organic insulating materials include thermoplastic resins such as glass epoxy resin, polyimide, fluorine resin, polynorbornene, and benzocyclobutene. The inorganic insulating materials include aluminum sintered compact oxide, aluminum sintered compact nitride, silicon carbide sintered compact, a silicon nitride sintered compact, a mullite sintered compact, and glass ceramics.

In particular, the first electronic component 3 and the second electronic component 5 described above may include, on their rear surfaces, a signal terminal, a power terminal, and a ground terminal. Each of the terminals is electrically coupled to surface-mounted electrode pads constituting portions of the first wiring conductor arranged on the first top surface 6 of the first substrate 4 and the second wiring conductor arranged on the second top surface 10 of the second substrate 7, via a surface-mounted conductive bump. According to the present disclosure, the electric and mechanical coupling may be referred to as mounting. The surface-mounted conductive bump is a solder bump composed of tin-lead (Sn—Pb) alloy or tin-silver-copper (Sn—Ag—Cu) alloy, or made of gold (Au).

The surface-mounted electrode pads are each electrically coupled to the predetermined circuit wiring through at least one of the wiring conductors arranged on the first substrate 4 and the second substrate 7, inner conductors arranged inside the first substrate 4 and the second substrate 7, through-conductors such as via-conductors formed from the surfaces of the first substrate 4 and the second substrate 7 to the insides thereof, and connectors 16, which will be described below. The terminals of the first electronic component 3 and the terminals of the second electronic component 5 are electrically coupled to corresponding circuit wiring via the surface-mounted electrode pads. In another example, the first electronic component 3 and the second electronic component 5 may be coupled to the wiring conductors of the first substrate 4 and the second substrate 7, respectively, via bonding wires.

Materials for the wiring conductor described above include, for example, copper (Cu), nickel (Ni), gold (Au), and silver (Ag). The wiring conductor may contain a metal material with a low melting point. The metal material with a low melting point may be used for wiring conductors organic substrates. The wiring conductor may be formed by a metal layer forming technique including thick-film methods and thin-film methods.

The first substrate 4 and the second substrate 7 may each be configured as organic substrates. Organic substrates include copper-clad substrates. Copper-clad substrates may have copper foil provided on top of, for example, a glass epoxy resin plate composed of a mixture of a base material made of an organic material such as the epoxy resin and glass fibers or glass powder. The wiring conductors may be formed by removing portions of the copper foil from the copper-clad substrate by pattern etching.

The first substrate 4 and the second substrate 7 may each utilize an inorganic insulating material. Substrates utilizing an inorganic insulating material may be produced by substrate forming methods including, for example, ceramic green sheet laminating and extrusion molding. The inorganic insulating material may include glass ceramics, alumina ceramics, aluminum nitride ceramics, etc.

Wiring conductors for the inorganic insulating materials may be formed from a sintered body that contains at least one of copper, gold, silver, tungsten, and molybdenum. The thickness of the wiring conductor may range from 5 µm to 50 µm.

The second substrate 7 includes a second bottom surface 15. The second bottom surface 15 faces the first top surface 6 of the first substrate 4. The electronic component package 1 includes a connector 16. The connector 16 mechanically couples the first top surface 6 of the first substrate 4 and the second bottom surface 15 of the second substrate 7. The connector 16 electrically couples the first wiring conductor of the first substrate 4 and the second wiring conductor of the second substrate 7. The connector 16 may serve as an interposer. The interposer may include a conducting pattern. The conducting pattern transmits an electrical signal between the first substrate 4 and the second substrate 7. A base material for the interposer may be, for example, an insulating material including an epoxy resin. The interposer may have a prism form extending in the second direction Y. The connector 16 serving as the interposer may be denoted as connector 16a. The connector 16 may be referred to as connector 16b when realized as solder bumps, as will be described below.

The first substrate 4 and the second substrate 7 are rectangular plates. The periphery 8 of the first substrate 4 includes four side portions 17a, 17b, 17c, and 17d. The periphery 9 of the second substrate 7 includes four side portions 18a, 18b, 18c, and 18d. The second substrate 7 is shorter than the first substrate 4 in the second direction Y. Among the four side portions 18a to 18d of the second substrate 7, the side portions 18a and 18b extending in a first direction X are positioned within the sealing member 2 throughout their lengths. The side portions 18a and 18b may be in contact with the sealing member 2 throughout their lengths. The side portions 18c and 18d extending in the second direction Y are exposed from side faces of the sealing member 2. A part of the second substrate 7 is exposed from the side faces of the sealing member 2. According to another embodiment, the side portion 18a alone, or all of the four side portions 18a to 8d of the second substrate 7 may be positioned within the side faces of the sealing member 2.

The sealing member 2 may be made of an insulating resin. Insulating resins include cured resin materials. Resin materials include thermosetting resin materials. The sealing member 2 may include a filler. Fillers may include insulating fillers and conductive fillers. Fillers having at least one of thermal conductivity and thermal expansion coefficient close to a desired range may be used. Thermosetting resin materials include, for example, epoxy-based thermosetting resins, polyimide-based thermoplastic resins, and bismaleimide-based thermosetting resins. The filler may include metals, metal oxides, and metal nitrides. Metal oxides may include aluminum oxide ($Al_2O_3$) and beryllium oxide (BeO). Metal nitrides include aluminum nitride (AlN). The filler may include a carbon-containing material, such as silicon carbide (SiC) and diamond.

A part of the second substrate 7 is positioned within the sealing member 2 formed across the first top surface 6 of the first substrate 4. The second substrate 7 may be substantially parallel with the first substrate 4. The sealing member 2 is integrally formed in the first space 12 between the first top surface 6 of the first substrate 4 and the second bottom surface 15 of the second substrate 7, the second space 13 on the second top surface 10 of the second substrate 7, and the third space 14 outside the side portions 18a and 18b of the second substrate 7. In a plan view, the third space 14 is positioned between the side portion 17a and the side portion 18a, and between the side portion 17b and the side portion 18b. The sealing member 2 integrally supports the first substrate 4 and the second substrate 7. The electronic component package 1 is highly resistant against, for example, separation between the first substrate 4 and the second substrate 7.

A part of the second substrate 7 is exposed from the side surface of the sealing member 2. The first substrate 4 and the second substrate 7 may be rectangular plates in a plan view. Because the side portions 18c and 18d of the second substrate 7 are exposed from the side faces of the sealing member 2, the second substrate 7 the area for mounting the second electronic component 5 thereon can be increased. The connectors 16 extends along the side portions 17c and 17d of the first substrate 4 and the side portions 18c and 18d of the second substrate 7 that are exposed from the side surfaces of the sealing member 2. A large area of the first substrate 4 between the connectors 16 for mounting the first electronic component 3 can be maintained. When the connectors 16 are prism interposers extending between the first substrate 4 and the second substrate 7, a number of electrodes can be coupled via a conductor between the first substrate 4 and the second substrate 7. When the connectors 16 are formed as large bumps, connection resistance between the first substrate 4 and the second substrate 7 may be reduced.

The first electronic component 3 and the second electronic component 5 are sealed by the sealing member 2 that is contiguously formed. Thus, heat generated by one or both of the first electronic component 3 and the second electronic component 5 can diffuse into the sealing member 2 provided throughout the first to third spaces 12 to 14. The diffused heat can dissipate into the air from the surface of the sealing member 2 in its entirety formed throughout the first to third spaces 12 to 14. The heat generated by one or both of the first electronic component 3 and the second electronic component 5 can be diffused by thermal conduction to the sealing member 2 in its entirety formed throughout the first to third spaces 12 to 14.

The first substrate 4 and the second substrate 7 are rectangular plates. The sealing member 2 extends integrally through a portion in the first space 12 and a portion in the second space 13 via a portion in the third space 14. Even when the heat generated by the first electronic component 3 is different from heat generated by the second electronic component 5, the generated heat can be diffused across the first to third spaces 12 to 14 and dissipated into the air from the surface of the sealing member 2 in its entirety.

The third space 14 having the sealing member 2 formed therein is positioned outside the side portions 18a and 18b. The sealing member 2 is made up of the portion in the first space 12 and the portion in the second space 13 coupled together via two portions in the third space 14. The electronic component package 1 has a high thermal conductivity between the sealing member 2 in the first space 12 and the sealing member 2 in the second space 13. Even when the heat generated by the first electronic component 3 is different from the heat generated by the second electronic component 5, the electronic component package 1 is capable of balanced diffusion of heat in the portion of the sealing member 2 in the first space 12 and the portion in the second space 13.

Portions of the sealing member 2 extends outside the side portions 18a and 18b throughout their lengths. The sealing member 2 can maintain a wide heat exchange path between the first space 12 and second space 13.

Because the sealing member 2 is formed from a thermosetting resin, in a state where the first substrate 4 having the first electronic component 3 mounted thereon and the second substrate 7 having the second electronic component 5 mounted thereon are vertically stacked, the thermosetting resin can be printed in a liquid state. A precursor of the thermosetting resin may be filled or applied in such a manner as to cover the first electronic component 3 mounted on the first substrate 4 and the second electronic component 5 mounted on the second substrate 7. The precursor of the thermosetting resin in the liquid state thermally cures, thus forming the sealing member 2 throughout the first to third spaces 12 to 14. In this way, the electronic component package 1 that is highly airtight and includes the first substrate 4 having the first electronic component 3 is mounted on the first top surface 6 and the second substrate 7 having the second electronic component 5 is mounted on the second top surface 10 may be produced.

The connector 16 formed by the interposer or a solder bump joins the first top surface 6 of the first substrate 4 and the second bottom surface 15 of the second substrate 7. The second bottom surface 15 of the second substrate 7 is electrically coupled to the wiring pattern on the second top surface 10. The first substrate 4 and the second substrate 7 are electrically coupled. The first substrate 4 and the second substrate 7 are mechanically and electrically coupled while vertically stacked. The connector 16 is positioned along the side portions 17c and 17d of the first substrate 4 and the side portions 18c and 18d of the second substrate 7 which are exposed from the side surfaces of the sealing member 2.

Figure 4A:
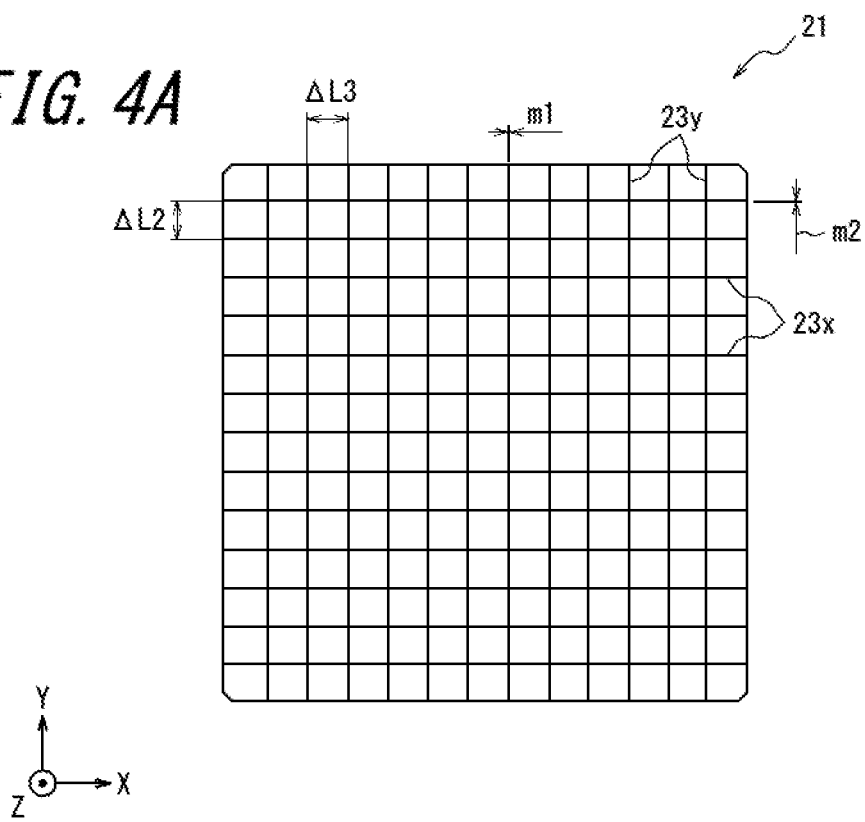
FIG. 4A is a plan view of a first substrate base member.
Figure 4B:
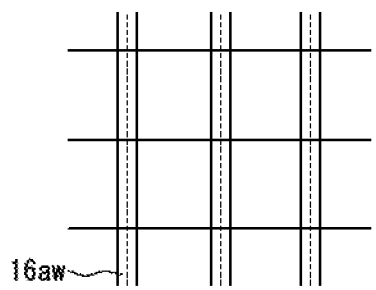
FIG. 4B is a plan view magnifying an example in which interposers serving as connectors are arranged.

FIG. 4 is a plan view of a first substrate base member 21. The first substrate base member 21 includes regions that constitute the first substrate 4. The first substrate base member 21 is made of the same material as the first substrate 4. The first substrate base member 21 may be a rectangular plate with, for example, a length of 70 mm on one side and a thickness of 100 µm to 400 µm. Electronic components are mounted on the first substrate base member 21 in the following manner by way of example: an IC and other electronic components are placed on the first substrate base member 21, followed by reflow soldering of the first substrate base member 21 and the electronic components.

The first substrate base member 21 is subdivided into segments by dicing. Each segment corresponds to the first substrate 4. The first substrate base member 21 is subdivided along subdividing lines 23x and subdividing lines 23y. The subdividing lines 23x extend along the first direction X. The subdividing lines 23x are arranged at intervals of ΔL2 in the second direction Y. The subdividing lines 23y are arranged at intervals of ΔL3 in the first direction X. The subdividing lines 23y extend along the second direction Y. For example, the intervals of ΔL2 are 5.05 mm, and the intervals of ΔL3 are 5.30 mm. For example, the subdividing lines 23x each have a width m1 of 0.15 mm, and the subdividing lines 23y each have a width m2 of 0.15 mm. The subdividing lines 23x and 23y may be a series of grooves. The subdividing lines 23x and 23y may be holes arranged at predetermined intervals.

According to some embodiments, each subdividing line 23y of the first substrate base member 21 is provided with a connector 16aw. The connector 16aw is base material to be subdivided to form an interposer. The connector 16aw may be provided along both sides of the subdividing line 23y. In this case, the connector 16aw includes a conductor that serves as the conducting pattern after being subdivided along the subdividing line 23y. The connector 16aw is subdivided by dicing along the subdividing line 23 and forms the connector 16a, which is the interposer of each electronic component package 1.

Figure 4C:
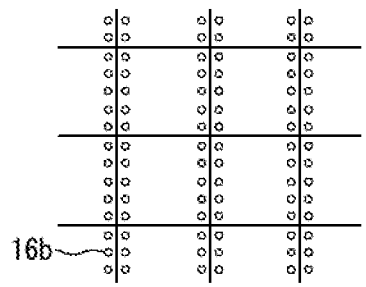
FIG. 4C is a plan view magnifying an example in which ball bumps serving as connectors are arranged.

As illustrated in FIG. 4C, the connector 16 may be a connector 16b formed by a solder bump for coupling the substrates. Connectors 16b are arranged on along both sides of the subdividing lines 23y. The connectors 16b may be arranged along the subdividing lines 23x in addition to the subdividing lines 23y.

FIG. 5 is a plan view of a second substrate base member 22. The second substrate base member 22 is made of the same material as the second substrate 7. The second substrate base member 22 is a rectangular plate having, for example, a length of 70 mm in one side and a thickness of 100 µm to 400 µm. The second substrate base member 22 includes slits 25. Electronic components are mounted on the second substrate base member 22 in the following manner: the IC and other electronic components are placed on the second substrate base member 22, followed by reflow soldering of the electronic components and the second substrate base member 22.

The second substrate base member 22 is subdivided into the segments by, for example, dicing. Each segment corresponds to the second substrate 7. The second substrate base member 22 is subdivided along subdividing lines 24x and subdividing lines 24y. The subdividing lines 24x extend along the first direction X. The subdividing lines 24x are arranged at intervals of ΔL4 in the second direction Y. The subdividing lines 24y are arranged at intervals of ΔL5 in the first direction X. The subdividing lines 24y extend along the second direction Y. For example, the intervals of ΔL5 in the first direction X are 5.30 mm, and the intervals of ΔL4 in the second direction Y are 5.05 mm. For example, the lines 24x each have a width m3 of 0.15 mm, and the lines 24y each have a width m4 of 0.15 mm. The subdividing lines 24x and 24y may be a series of grooves. The subdividing lines 24x and 24y may be holes arranged at predetermined intervals.

The second substrate base member 22 includes slits 25. The slits 25 of the second substrate base member 22 extend in the first direction X. The slits 25 may be formed by various processes including, for example, mold stamping or dicing. Each of the slits 25 may be continuous to any one of the subdividing lines 24x. The slits 25 each have a width ΔL6 that is parallel with the second direction Y and wider than the width m3 of the subdividing line 24x. The width ΔL6 of the slit 25 may be, for example, 1.00 mm.

Figure 6:
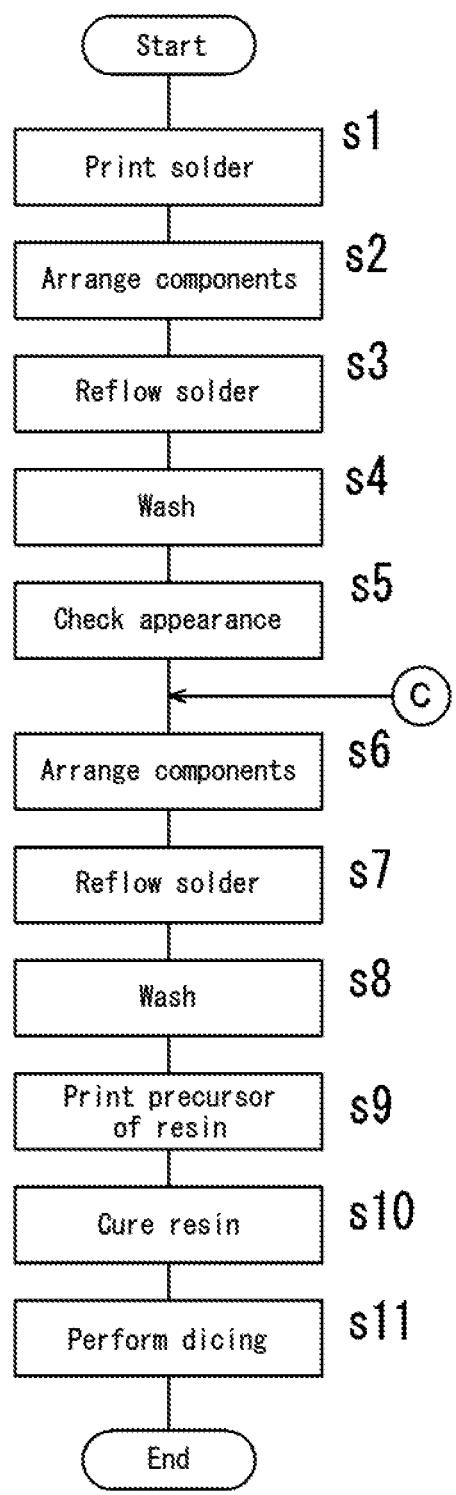
FIG. 6 is a flowchart illustrating an example of a manufacturing process of an electronic component package.
Figure 8A:
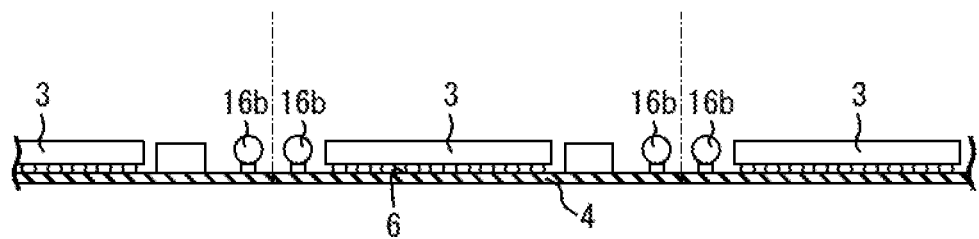
FIG. 8A is a simplified cross-sectional view illustrating an example of a manufacturing process of an electronic component package.
Figure 8B:
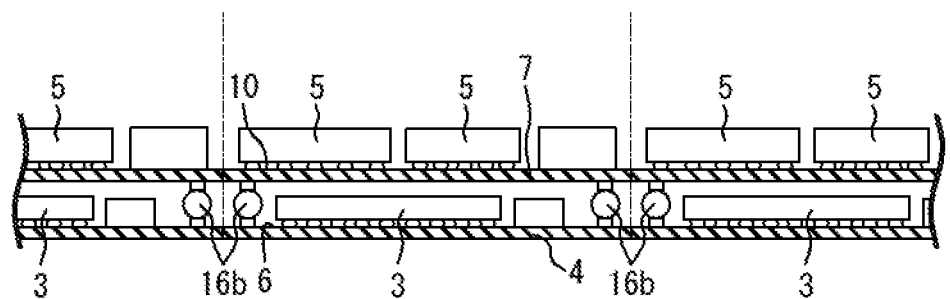
FIG. 8B is a simplified cross-sectional view illustrating an example of a manufacturing process of an electronic component package.
Figure 8C:
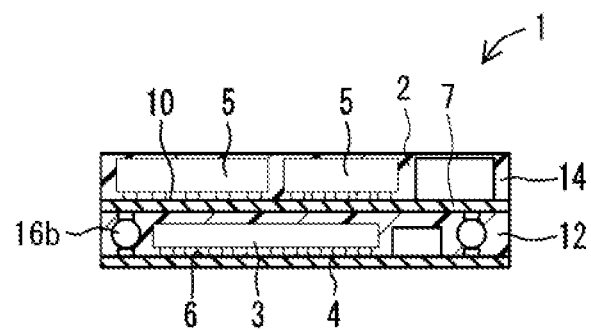
FIG. 8C is a simplified cross-sectional view illustrating an example of a manufacturing process of an electronic component package.

FIG. 6 and FIG. 7 are flowcharts illustrating an example of the manufacturing process of the electronic component package 1. FIG. 8A to FIG. 8C are cross-sectional diagrams illustrating an example of the manufacturing process of the electronic component package 1 in a simplified manner.

In step s1, solder paste is applied to the wiring conductor of the first substrate base member 21. The solder paste is applied to the wiring conductor including the first wiring conductor of the first substrate 4 after being subdivided. The solder paste is applied to a region including a region where the solder bumps serving as the connectors 16b are to be formed. The solder paste is applied by printing including, for example, screen printing. In step s2, the first electronic component 3 and other electronic components are arranged on the first wiring conductor. In step s3, the first substrate base member 21 having the first electronic component 3 and other electronic components arranged thereon is subjected to reflow soldering. By reflow soldering, the first electronic component 3 and other electronic components are mounted on the first substrate base member 21 via solder. The solder paste is melt by the reflow soldering and forms the solder bumps serving as the connectors 16b. In step s4, the first substrate base member 21 having the first electronic component 3, other electronic components, and the connectors 16 mounted thereon as illustrated in FIG. 8A is washed. In FIG. 8A, the boundaries to be subdivided into the segments by dicing, which will be described below (step s11), are indicated by the dashed lines. The washing removes particles and organic substances adhering to the first substrate base member 21. In step s5, the first substrate base member 21 having the first electronic component 3, other electronic components, and the connectors 16 mounted thereon is subjected to visual inspection.

In the example of the manufacturing process of the electronic component package 1, steps s21 to s25 are executed in parallel with steps s1 to s5. In step s21, solder paste is printed on the wiring conductor of the second substrate base member 22 having the slits 25. The solder paste is applied to the wiring conductor including the second wiring conductor on the second top surface 10 of the second substrate 7 after being subdivided. The solder paste is applied by printing including, for example, the screen printing. In step s22, the second electronic component 5 and other electronic components are arranged on the second wiring conductor. In step s23, the second substrate base member 22 having the second electronic component 5 and other electronic components arranged thereon is subjected to reflow soldering. By reflow soldering, the second electronic component 5 and other electronic components are mounted on the second substrate base member 22 via solder. In step s24, the second substrate base member 22 having the second electronic component 5 and other electronic components mounted thereon is washed. The washing removes particles and organic substances adhering to the second substrate base member 22. In step s25, the second substrate base member 22 is subjected to visual inspection.

By following steps s1 to s5 described above, the first substrate base member 21 having the first electronic component 3, other electronic components, and the connector 16 mounted thereon is prepared. By following steps s21 to s25, the second substrate base member 22 having the second electronic component 5 and other electronic components mounted thereon is prepared. In step s6, the second substrate base member 22 is placed on top of the first substrate base member 21 via the connector 16. In step s7, in a state in which the second substrate base member 22 is placed on top of the first substrate base member 21 via the connector 16, the first and second substrate base members 21 and 22 are subjected to reflow soldering. By reflow soldering, the bump serving as the connector 16b melts and electrically couples the first substrate base member 21 and the second substrate base member 22 as illustrated in FIG. 8B.

In step s8, the assembled substrate in which the second substrate base member 22 is mounted on the first substrate base member 21 is washed. The washing removes particles and organic substances adhering to the assembly substrate. In step s9, a resin precursor of the thermosetting resin in a liquid state is printed on the assembled substrate of the first substrate base member 21 and the second substrate base member 22 using a metal mask. By printing, the resin precursor in the liquid state is filled between the first substrate base member 21 and the second substrate base member 22 and covers the second electronic component 5 and other electronic components mounted on the second substrate base member 22. In other words, the resin precursor is filled in spaces corresponding to the first to third spaces 12 to 14.

In step s10, the resin precursor filled in or applied to the assembled substrate of the first substrate base member 21 and the second substrate base member 22 cures in heat in a batch furnace. When cured, the resin precursor serves as the sealing member 2 filling the first space 12 to third space 14. In step s11, the assembled substrate of the first substrate base member 21 and the second substrate base member 22 is subjected to dicing. The dicing is performed in the first direction X and the second direction Y. By dicing, the assembled substrate of the first substrate base member 21 and the second substrate base member 22 is subdivided into the segments as illustrated in FIG. 8C. Each segment after subdividing serves as the electronic component package 1. As illustrated in FIG. 8C, each segment after subdividing includes the sealing member 2 formed across the first top surface 6 of the first substrate 4. After subdividing, each segment the second substrate 7 is positioned within the sealing member 2.

The side portions 18a and 18b of the second substrate 7 each correspond to a portion of the slit 25. The third space 14 corresponds to a space on the first substrate base member 21 inside the slit 25 in a plan view.

Figure 9A:
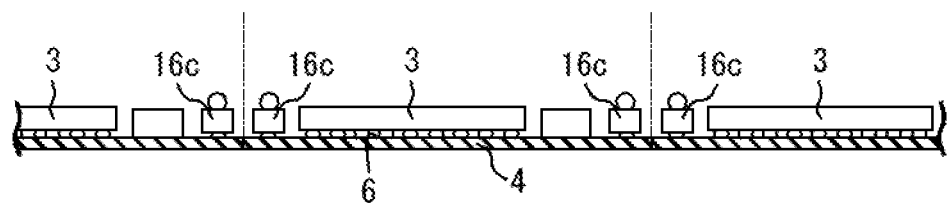
FIG. 9A is a simplified cross-sectional view illustrating a manufacturing process of an electronic component package according to another one of embodiments.
Figure 9B:
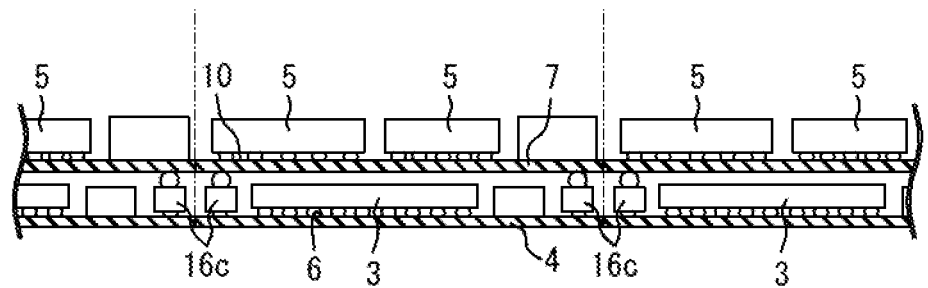
FIG. 9B is a simplified cross-sectional view illustrating a manufacturing process of an electronic component package according to another one of embodiments.
Figure 9C:
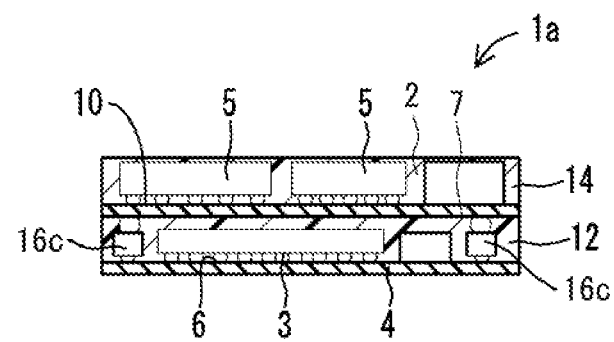
FIG. 9C is a simplified cross-sectional view illustrating a manufacturing process of an electronic component package according to another one of embodiments.

The connector 16 may be a connector 16c configured with a connection conductor enclosed in an insulating sleeve. In the connector 16c, the connection conductor has a substantially cylindrical shape and is enclosed in the insulating sleeve formed from an insulating resin. The first wiring conductor of the first substrate base member 21 and the second wiring conductor of the second substrate base member 22 may be electrically coupled via the connector 16c. The connector 16c is arranged on the first substrate base member 21 in step s2 and mounted thereon in step s3. FIGS. 9A to 9C are diagrams each illustrating a part of the manufacturing process using the connector 16c that includes the insulating sleeve. FIGS. 9A to 9C correspond to FIGS. 8A to 8C, respectively.

The side portions 18a, 18b, 18c, and 18d of the second substrate 7 do not need to be exposed throughout their entire lengths from the side surface of the sealing member 2. In other words, the third space 14 may extend over the side portions 18a to 18d in plan view.

The sealing member 2 configured as described above enables the first substrate 4 and the second substrate 7 to be joined with high strength. The third space 14 of the sealing member 2 enables an increase in a heat transfer area between the first space 12 and the second space 13. Even when a large amount of heat is generated in one of the first electronic component 3 and the second electronic component 5, the generated heat is rapidly diffused into the sealing member 2 in the first to third spaces 12 to 14.

The electronic component package 1 may include a film-like conductive member on the surface of the sealing member 2. The film-like conductive member is formed by, for example, vapor deposition to the surface of the sealing member 2. The first substrate 4 and the second substrate 7 are molded according to the film-like conductive member. The film-like conductive member of the electronic component package 1 serves as an electromagnetic shield.

The electronic component package 1 may include a conductive member on the entire surface or a part of the surface of the sealing member 2. The electronic component package 1 may include the conductive member on a region that requires electromagnetic shielding. By having the conductive member on the surface of the sealing member 2, the electronic component package 1 can separately provide a sealing function with the thermosetting resin and an electromagnetic shielding property with the conductive member.

The sealing member 2 may be a mixture of a thermosetting resin such as an epoxy resin and a magnetic material such as ferrite. The sealing member 2 in this configuration has airtight properties and electromagnetic shielding properties.

After the visual inspection in step s25 as described above, the second substrate base member 22 may be subjected to dicing along the subdividing lines 24x and 24y. In this case, the second substrate 7 of each segment is mounted on the first substrate base member 21 in step s6.

The present disclosure is not limited to the electronic component package 1 having a two-layer structure of the first substrate 4 and the second substrate 7 but includes an electronic component package having a structure with three or more layers.

Figure 10:
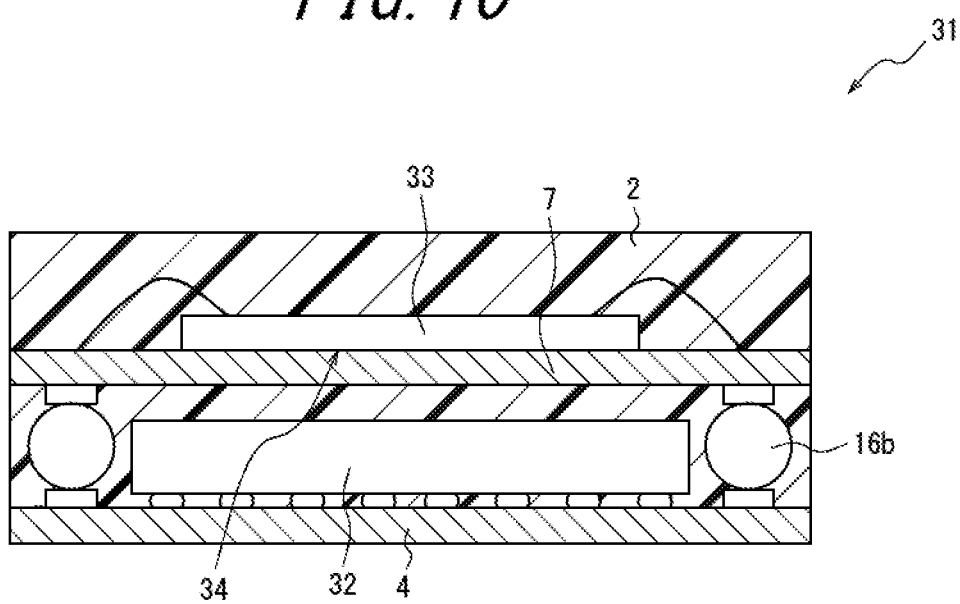
FIG. 10 is cross-sectional view of an electronic component package according to one of embodiments.

The electronic component package of the present disclosure is applicable also to a wireless module having an antenna. An electronic component package 31 according to one of embodiments of the present disclosure is illustrated in FIG. 10. The electronic component package 31 includes the first substrate 4 having a radio module 32 mounted thereon and the second substrate 7 having an antenna 33 mounted thereon. A resonator 34 capable of functioning as a frequency selective surface (FSS) may be arranged between the antenna 33 and the second substrate 7. The resonator 34 may be arranged inside of, or on the bottom surface of, the second substrate 7. In FIG. 10, elements the same as or similar to those of the embodiment in FIG. 1 to FIG. 3 are denoted by the same reference signs, and descriptions thereof will be omitted.

The resonator 34 may be configured to resonate in response to incident of electromagnetic waves and may have unit conductors for reflecting electromagnetic waves of a predetermined wavelength cyclically arranged in a two-dimensional manner. The unit conductor may be, for example, a thin metal film. The FSS, in combination with an electrically grounded portion, may function as an artificial magnetic conductor (AMC). The AMC may reflect incident electromagnetic wave substantially in phase.

In the electronic component package 31, the antenna 33 may be positioned in the vicinity of a conductive surface. Radio waves having a frequency close to the resonance frequency of the resonator 34 radiated from the antenna 33 may reduce the destructive interference with the radio wave reflected on the conductive surface and radiate to the side opposite to the conductor surface. For example, the electronic component package 31 may be arranged in the vicinity of a top surface of a flat metal battery such as a button cell. The resonator 34 may be arranged on a top surface of the radio module 32 or between the first substrate 4 and the radio module 32.

It is to be appreciated that the present disclosure is not limited to the embodiments set forth above and may include various changes within the scope of the present disclosure.

REFERENCE SIGNS LIST

1 electronic component package
2 sealing member
3 first electronic component
4 first substrate
5 second electronic component
6 first top surface
7 second substrate
8 periphery of first substrate 4
9 periphery of second substrate 7
10 second top surface
12 first space
13 second space
14 third space
15 second bottom surface
16 connector
17a to 17d; 18a to 18d side portion
21 first substrate base member
22 second substrate base member
23x, 23y; 24x, 24y subdividing line
25 slit
31 electronic component package
32 radio module
33 antenna
34 resonator (frequency selective surface)

The invention claimed is:

1. An electronic component package comprising:
    a first substrate having a first surface on which a first electronic component is mounted;
    a sealing member positioned on the first surface and configured to seal the first electronic component and a second electronic component;
    a second substrate having a second surface on which the second electronic component is mounted, and positioned within the sealing member, the second surface having a wiring pattern formed thereon; and
    a connector configured to electrically couple the first substrate and the second substrate,
    wherein the second substrate has
        a first pair of opposite sides covered by the sealing member, and
        a second pair of opposite sides different from the first pair of opposite sides and exposed from the sealing member.

2. The electronic component package according to claim 1, wherein the second pair of opposite sides of the second substrate is exposed from side faces of the sealing member.

3. The electronic component package according to claim 2, wherein the first substrate and the second substrate are rectangular plates in a plan view.

4. The electronic component package according to claim 3, wherein the connector is arranged along the second pair of opposite sides of the second substrate.

5. The electronic component package according to claim 4, wherein the connector includes prism shaped interposers extending along the second pair of opposite sides of the second substrate and between the first substrate and the second substrate.

6. The electronic component package according to claim 1, wherein the connector includes bumps.

7. The electronic component package according to claim 1, wherein the connector includes a connection conductor enclosed in an insulating sleeve.

8. The electronic component package according to claim 1, wherein the sealing member is made of a cured resin material.

9. The electronic component package according to claim 8, wherein the sealing member contains an insulating filler having a thermal conductivity higher than a thermal conductivity of the resin material.

10. The electronic component package according to claim 1, wherein an entirety of the connector is covered by the sealing member, the first substrate, and the second substrate.

* * * * *